United States Patent
Nayak et al.

(10) Patent No.: US 9,824,174 B2
(45) Date of Patent: Nov. 21, 2017

(54) POWER-DENSITY-BASED CLOCK CELL SPACING

(71) Applicant: QUALCOMM Incorporated, San Diego, CA (US)

(72) Inventors: Ankita Nayak, San Diego, CA (US); David Anthony Kidd, San Diego, CA (US); Paul Ivan Penzes, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 196 days.

(21) Appl. No.: 14/852,340

(22) Filed: Sep. 11, 2015

(65) Prior Publication Data

US 2017/0076030 A1  Mar. 16, 2017

(51) Int. Cl.
*G06F 17/50* (2006.01)

(52) U.S. Cl.
CPC ...... *G06F 17/5072* (2013.01); *G06F 2217/62* (2013.01)

(58) Field of Classification Search
USPC .......................................................... 716/120
See application file for complete search history.

(56) References Cited

U.S. PATENT DOCUMENTS

| | | | |
|---|---|---|---|
| 6,538,314 B1* | 3/2003 | Buffet ................. | H01L 23/5286 257/208 |
| 8,601,428 B2 | 12/2013 | Burrell et al. | |
| 9,032,356 B2 | 5/2015 | Monthie et al. | |
| 2003/0135830 A1* | 7/2003 | Buffet ................. | G06F 17/5036 716/111 |
| 2004/0155681 A1* | 8/2004 | Buffet ............... | H01L 27/11898 326/101 |
| 2006/0119393 A1* | 6/2006 | Hua .................... | H03K 19/0016 326/121 |
| 2006/0265681 A1* | 11/2006 | Bakir ................. | G06F 17/5036 716/120 |
| 2007/0239387 A1* | 10/2007 | Douriet ............ | G01R 19/16552 702/117 |
| 2008/0141202 A1 | 6/2008 | Matsumura et al. | |
| 2009/0033398 A1 | 2/2009 | Dennis et al. | |

(Continued)

OTHER PUBLICATIONS

International Search Report and Written Opinion—PCT/US2016/040709—ISA/EPO—Feb. 14, 2017.

(Continued)

*Primary Examiner* — Suchin Parihar
(74) *Attorney, Agent, or Firm* — Arent Fox LLP

(57) ABSTRACT

Techniques for power-density-based clock cell spacing and resulting integrated circuits (ICs) are disclosed herein. In one example, the techniques determine power-usage density for different types of clock cells, as power-usage density relates to heat and IR droop. With the power-usage density for each type of clock cell determined, the techniques assign a keep-out region for each type of clock cell that is not fixed for all types of clock cells. These regions are instead based on the heat and IR droop corresponding to estimated power-usage density for each type of clock cell. Clock cells are then placed in a layout of an IC. The resulting IC has clock cells spaced sufficiently to reduce heat and IR droop while concurrently having excellent timing closure and performance.

30 Claims, 8 Drawing Sheets

(56) References Cited

U.S. PATENT DOCUMENTS

| | | | |
|---|---|---|---|
| 2009/0222772 A1* | 9/2009 | Charlebois | G06F 17/505 716/133 |
| 2009/0295402 A1* | 12/2009 | Balch | G01R 31/2884 324/537 |
| 2014/0075404 A1 | 3/2014 | Chuang et al. | |
| 2014/0145347 A1 | 5/2014 | Samadi et al. | |
| 2014/0372823 A1 | 12/2014 | Dimri | |

OTHER PUBLICATIONS

Partial International Search Report—PCT/US2016/040709—ISA/EPO—Oct. 31, 2013.

* cited by examiner

POWER-DENSITY-BASED CLOCK CELL SPACING

BACKGROUND

Field of the Disclosure

This disclosure relates generally to the physical design of an integrated circuit (IC) and, more specifically, to distributing, in an IC, clock cells based on the power density of those clock cells.

Description of Related Art

Most integrated circuits (ICs) include high-power and low-power cells, such as high-power clock cells and low-power data cells. To increase IC performance in advanced semiconductor processing nodes, these cells are more and more densely spaced. Adding to this general trend of densely spacing cells, IC performance is improved by densely packing clock cells together. This dense clustering of clock cells, however, can cause local dynamic hot spots in an IC design, which increases the likelihood of thermal runway and substantial IR droop.

One traditional way to handle this problem is to space out the clock cells by a spacing value. Doing so, however, sacrifices performance of the IC design. Performance is sacrificed because it is difficult to find an optimal spacing value. Smaller spacing values can still cause thermal runway and IR droop while larger spacing values can cause timing-closure issues and reduce performance.

SUMMARY

In an example aspect, an integrated circuit is disclosed. The integrated circuit (IC) includes multiple clock cells of a first type having a first keep-out region, the first type having a first power-usage density and multiple clock cells of a second type having a second keep-out region. The first and second types of clock cells have different power-usage densities, with a higher of the first and second power-usage density having a larger keep-out region. The IC also includes a layout of the multiple clock cells on the integrated circuit, the layout separating the multiple clock cells of the first type and second type such that the respective keep-out regions of the respective clock cells do not overlap.

In an example aspect, a method is disclosed. The method receives or determines, for a first type of clock cell, a first keep-out region and, for a second type of clock cell, a second keep-out region. With the keep-out regions, the method places the first type of clock cell and the second type of clock cell without overlap of the first keep-out region and the second keep-out region.

In an example aspect, an integrated circuit is disclosed. The integrated circuit includes a clock-cell layout, the clock-cell layout based on respective power-usage densities of multiple clock cell types in the integrated circuit. The clock-cell layout has a first keep-out region associated with clock cells of a first type, wherein the first type has a first power-usage density, a second keep-out region associated with clock cells of a second type, the second type has a second power-usage density, and a third keep-out region associated with clocks cells of a third type, the third type has a third power-usage density. The first power-usage density is higher than the second power-usage density and the second power-usage density higher than the third power-usage density. In this clock-cell layout, the first keep-out region represents an average of a total of multiple flexible keep-out regions around each of the clocks cells of the first type, the second keep-out region represents an average of a total of multiple flexible keep-out regions around each of the clocks cells of the second type, and the third keep-out region represents an average of a total of multiple flexible keep-out regions around each of the clocks cells of the third type. Also, the first keep-out region is larger than the second keep-out region and the second keep-out region is larger than the third keep-out region. Thus, a larger width spacing or a larger height spacing for the keep-out regions can be used.

In an example aspect, a placement system is disclosed. The placement system can include computer processors and computer-readable media having instructions that, responsive to execution by the one or more computer processors, implements a placement manager. The placement manager is configured to receive, for first and second types of clock cells, first and second keep-out regions. With the keep-out regions, the placement manager places, in an integrated circuit, the first type of clock cell and the second type of clock cell without overlap of the first keep-out region and the second keep-out region.

DETAILED DESCRIPTION

Overview

Figure 1:
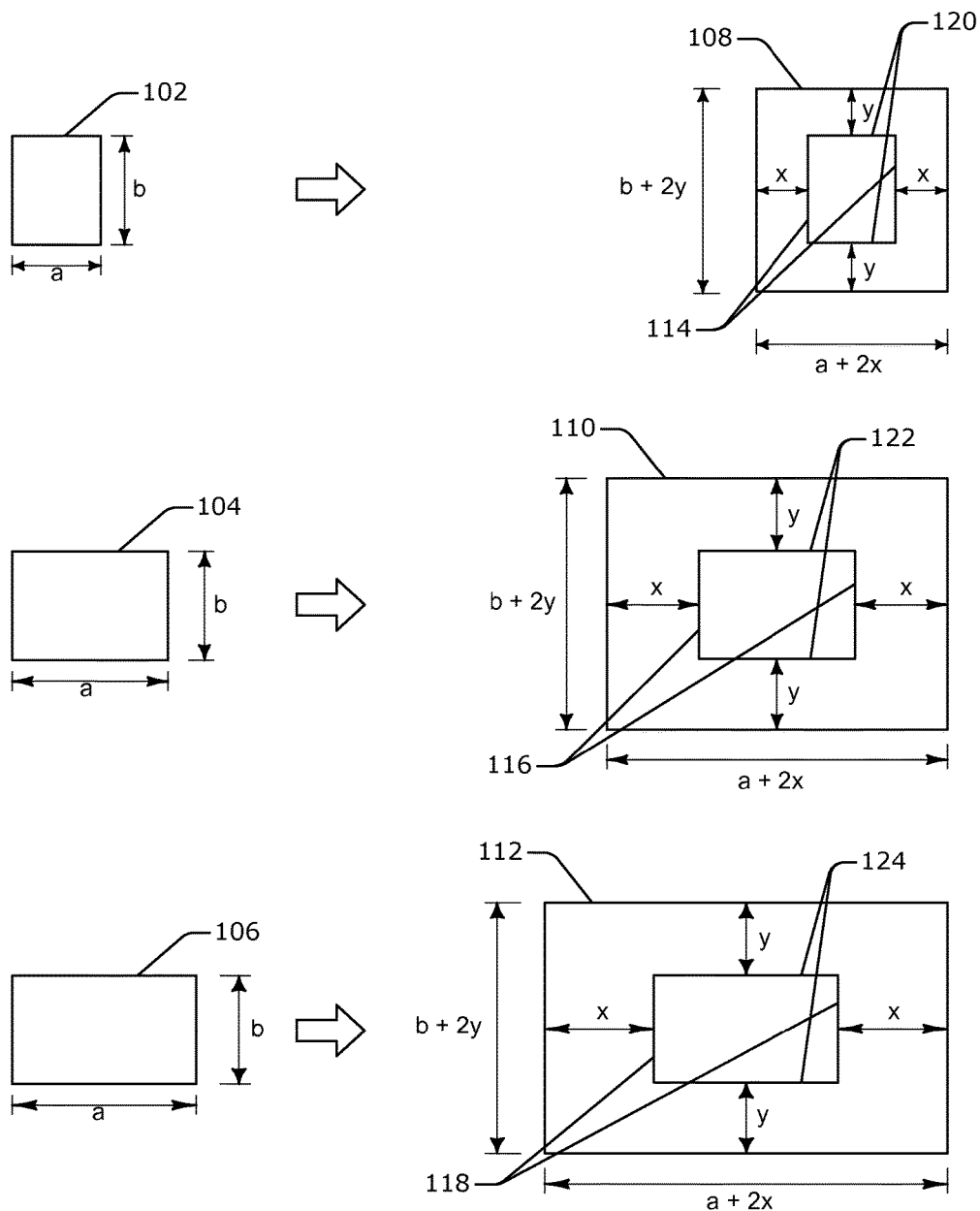
FIG. 1 illustrates three example keep-out regions for three different clock cells, a small clock cell, a medium clock cell, and a large clock cell.

As noted above, traditionally, heat and IR droop are addressed by spacing out clock cells by a spacing value. This spacing value, however, often does not sufficiently address heat and IR droop or sacrifices performance of the IC design.

There are many different types of clock cells, producing different quantities of heat and IR droop. Because of this, the techniques described in this document estimate power-usage density for each of the different types of clock cells, as the density of power usage relates to heat and IR droop. With the power-usage density for each type determined, the techniques assign a keep-out region that, in contrast to traditional techniques, is not fixed for all types of clock cells. This region is instead based on the heat and IR droop corresponding to estimated power-usage density for each type of clock cell. By so doing, the layout for clock cells can better address both sufficient space to reduce heat and IR droop while concurrently permitting excellent timing closure and performance.

By way of example, assume that an IC is designed having four different clock cells. These four different clock cells are differently sized and, more importantly, have different power-usage densities. In building the architecture for the IC, but prior to layout of the clock and data cells, multiple clock cells of each of the four types are selected. Based on estimated power-usage density for each of the four clock cell types, the techniques determine, for the four clock cell types, keep-out regions in the width ("X") and height ("Y") spacing of 1.5 units, 2 units, 3 units, and 4.5 units, respectively. The term "units" is used herein to convey the variance of sizes in keep-out regions, which depend on numerous factors, including transistor size, materials, power-usage densities, and so forth. In this example case, a 14 nanometer node is assumed, and thus the units are microns. During placement of these clock cells, a placement module creates a layout for the clock cells and data cells where the keep-out regions of the clock cells do not overlap. During use of the IC, sufficient space is maintained around the clock cells so that negative thermal effects, including IR droop, are avoided. Further, clock cells that have low power-usage density, such as types one and two, can be fairly close to each other. Thus, a first type and a second type can be even 3.5 units separated, the 1.5 of type one plus the 2 of type two. In contrast, the high power-usage density and accompanying high thermal output of the fourth clock cell type is spaced sufficient for that type of clock cell to dissipate heat without negative thermal effects, such as 9 units separating two clock cells of the fourth type.

This is but one simple example of ways in which techniques for power-density-based clock cell spacing can be performed. Other examples are provided below. This document now turns to an example environment, after which example systems and methods are described.

Example Keep-Out Regions for Different Types of Clock Cells

FIG. 1 illustrates three example keep-out regions for three different clock cells, small clock cell 102, medium clock cell 104, and large clock cell 106. The keep-out regions in this example are rectangles surrounding, in a plane, each of the clock cells 102, 104, 106. As shown, a small keep-out region 108 and a medium keep-out region 110 have a same size in both a width spacing (X on each side) and a height spacing (Y on each side), respectively. Large keep-out region 112 has a larger spacing in the width spacing than the height spacing. The three keep-out regions 108, 110, and 112 are differently sized for each clock cell. Here the width spacing is a distance from each of two width borders of the clock cells, marked at width borders 114, 116, and 118, respectively. The height spacing, similarly, is a distance from each of two height borders of the clock cells, marked at height borders 120, 122, and 124, respectively. The dimensions of each of the keep-out regions 108, 110, and 112 are also shown as the size of the cell, as a or b, sum with the portion of the region surrounding the cell, namely:

Total Width of Keep-Out Region: $a+2x$

Total Height of Keep-Out Region: $b+2y$

Figure 2:
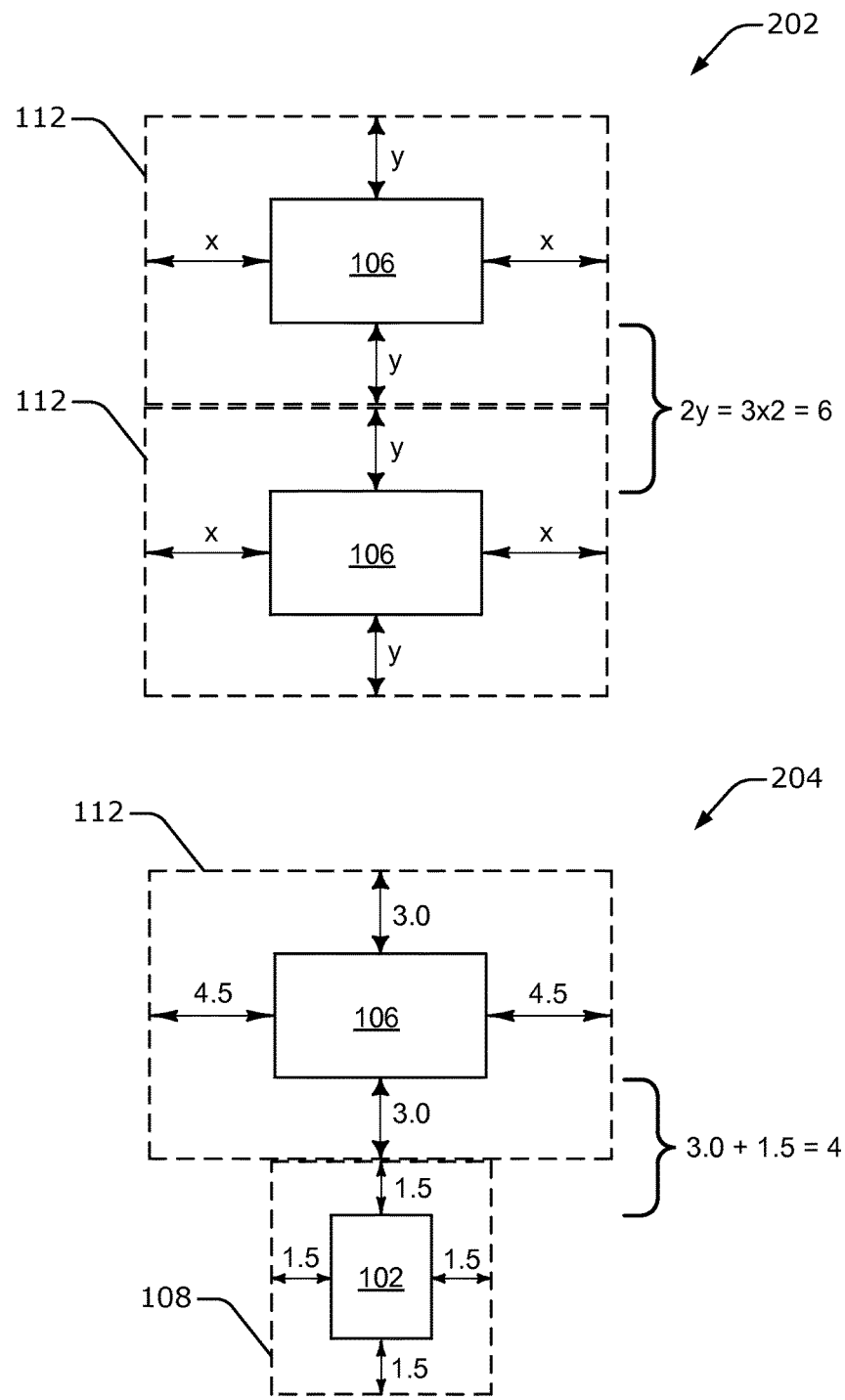
FIG. 2 illustrates example permitted clock cell placements and their keep-out regions.

Therefore, placement of clock cells is made such that keep-out regions do not overlap. Continuing this example, consider FIG. 2, which illustrates permitted clock cell placements and their keep-out regions. Layout portion 202 illustrates two identical types of clock cells, here the large clock cells 106 both having the large keep-out regions 112. Both of the clock cells 106 are spaced as close as is permitted by the keep-out regions 112. Note that they are spaced by 2y, between the clock cells 106, with y being 3.0 as noted above. Layout portion 204 illustrates two different types of clock cells, the large clock cell 106 and the small clock cell 102, with both clock cells as close as is permitted by the keep-out regions 112 and 108. Here, because spacing in the height and width are different, numbers are used for clarity. For the keep out region 112, height spacing is 3.0. For the keep-out region 108, height and width spacing are both 1.5, for a combined spacing between the cells in the height dimension of 4.5.

Figure 3:
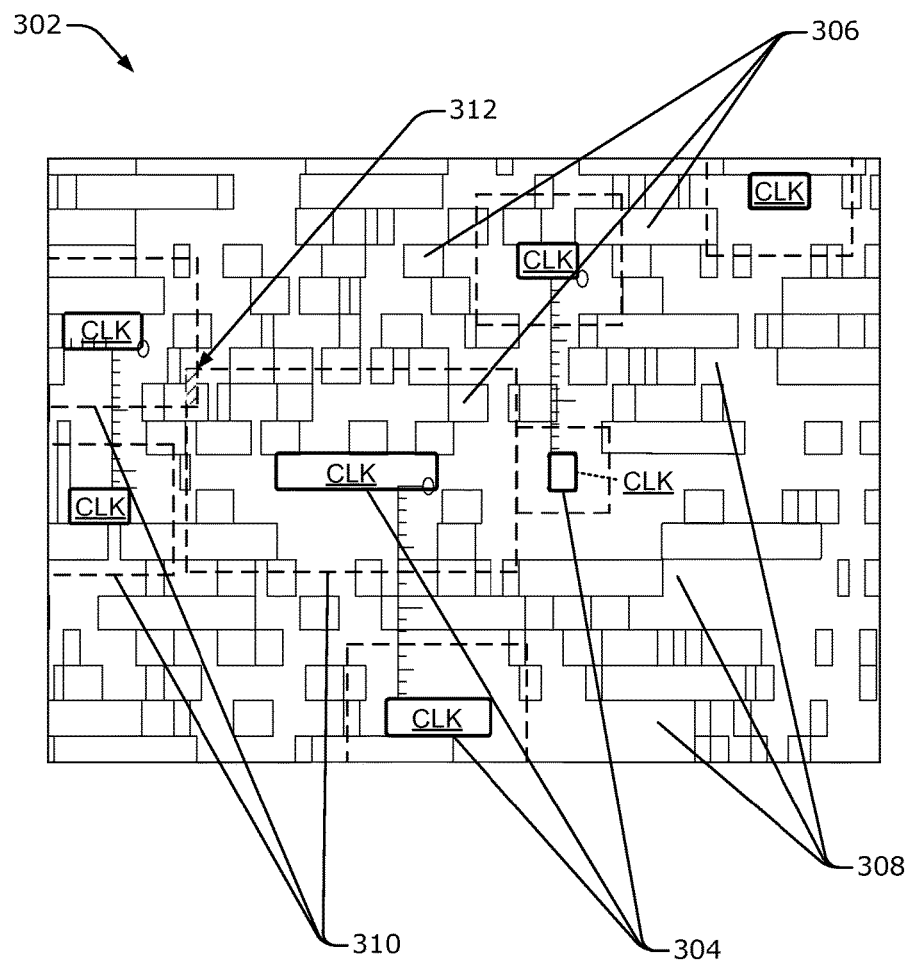
FIG. 3 illustrates an example layout of a portion of an integrated circuit (IC) that spaces clock cells sufficiently to reduce heat and negative effects of IR droop while concurrently permitting excellent timing closure and performance.

Concluding the example, consider FIG. 3, which illustrates a layout 302 of a portion of an integrated circuit (IC). The layout 302 permits clock cells 304 that are spaced sufficiently to reduce heat and even eliminate negative effects of IR droop while concurrently permitting excellent timing closure and performance. Seven example clock cells 304 are shown, as are many data cells 306 (three marked only for visual clarity) and free space 308 (three marked only for visual clarity) in the layout 302. These clock cells 304 include a mix of same and different types, with each type shown having a particular keep-out region 310 (shown in dashed-line rectangles, only three marked). Note that two of these keep-out regions 310 overlap, shown at region overlap 312. This overlap is acceptable in some cases and not in others, based on the shape of the keep-out region 310 for the clock cells 304. This region overlap 312 will be described in greater detail below.

Example Methods

With example keep-out regions and a layout described above, the discussion turns to example methods for power-density-based clock cell spacing. Following these methods, other example keep-out regions and an example electronic device environment will be described.

Figure 4:
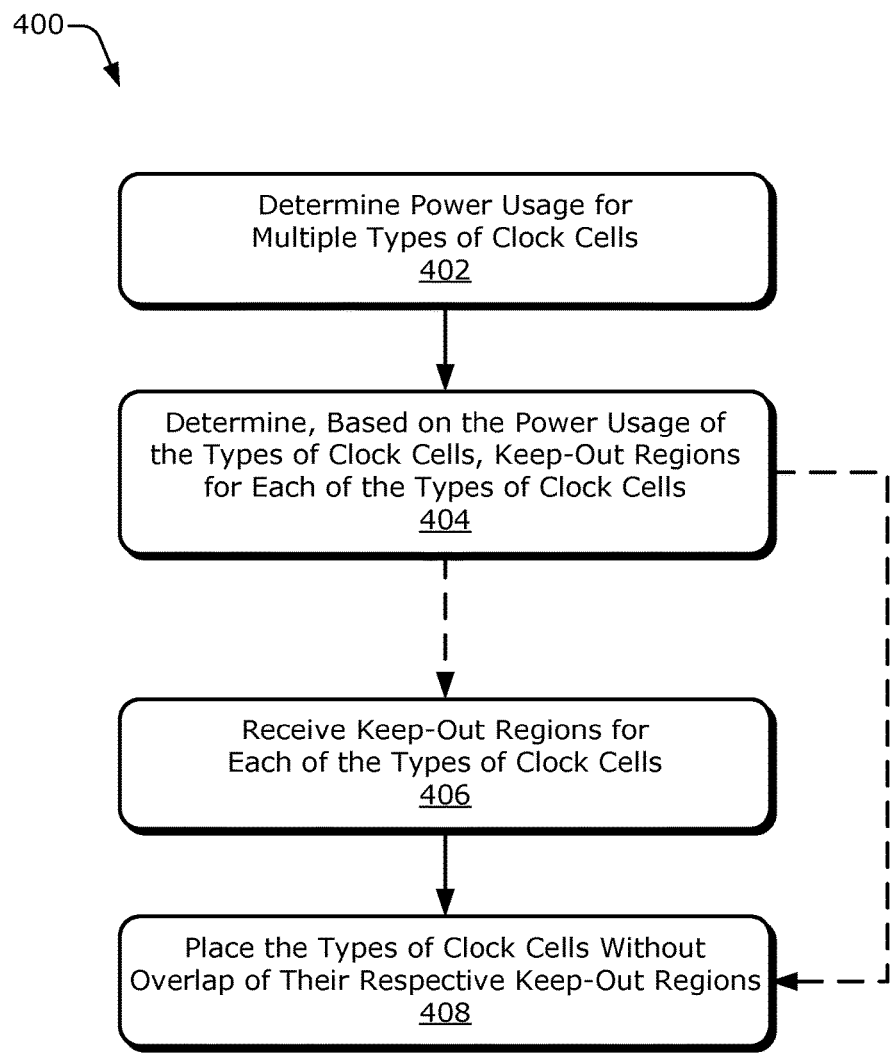
FIG. 4 illustrates an example method for determining keep-out regions for clock cells based on the power-usage density of those clock cells or receiving and placing those clock cells without overlap of their respective keep-out regions.

FIG. 4 illustrates a method 400 for determining keep-out regions for clock cells based on the power-usage density of those clock cells. This method is shown as blocks that specify operations performed but are not necessarily limited to the order or combination. In portions of the following discussion, reference may be made to FIGS. 1-3 and FIGS. 5-8, which are intended as non-limiting examples only.

At 402, power-usage density is determined for multiple types of clock cells. This power-usage density can approximate potential thermal output at a particular state or condition. These states or conditions can vary, and thus the power-usage density determined for each type of clock cell may also vary.

Figure 5:
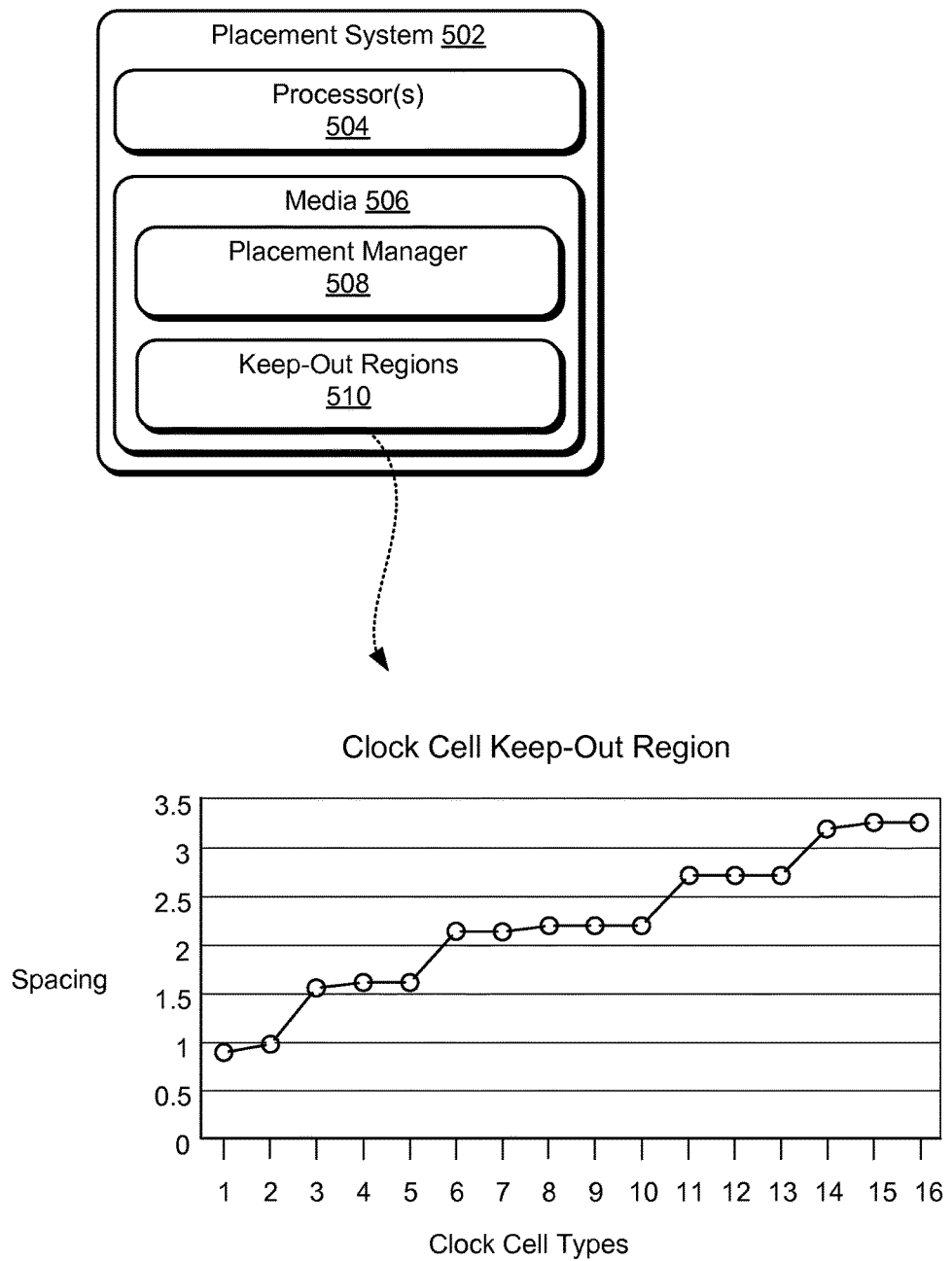
FIG. 5 illustrates an example placement system, which includes a placement manager.

For example, consider FIG. 5, which illustrates a placement system 502. The placement system 502 includes one or more computer processors 504 and computer-readable storage media ("media") 506. The media 506 may include any suitable type of data storage media, such as volatile memory, non-volatile memory, optical media (e.g., disc), magnetic media (e.g., disk or tape), and the like.

The media 506 includes or has access to a placement manager 508. The placement manager 508 is configured to determine power-usage densities and keep-out regions (or receive keep-out regions if already determined), and based on these keep-out regions, place clock cells to build an IC. The placement manager 508 may also place other cells, such as data cells, within those keep-out regions, as the power-usage density of data cells is low. The functions described for the placement manager 508 may be implemented in hardware, software, firmware, or any combination thereof. If implemented in software, functions may be stored as executable instructions on the media 506. By way of example, and not limitation, the media 506 can comprise RAM, ROM, EEPROM, CD-ROM or other optical disk storage, magnetic disk storage, or other magnetic storage devices, or any other non-transitory medium that can be used to carry or store information.

The placement manager 508 can determine power-usage density for the types of clock cells can be based on various states and conditions assumed as part of the determination. First, the power-usage density can be estimated for each clock cell based on the maximum power-usage density for each clock cell, which assumes that the clock cells are operating fully and all the time. Second, the power-usage density can be estimated for each type of clock cell based on average or median power-usage density. Third, a non-maximum power-usage density can be used that removes rare cases of high-power-usage density, such that a power-usage density is set at the highest power-usage density for some high percentage (e.g., 99%) of the possible scenarios of use. Further still, each of these power-usage estimates can also be based on likely usage for the core in which the clock cell will be placed. Thus, some cores (e.g., GPU, CPU, memory, and modem, described below), may have higher power-usage densities due to variances in how each is used.

Note also that power-usage density, on some cases, can be based on power usage of a clock cell with little regard for a size of the clock cell when the types of clock cells used are about a same size. In many cases, however, larger clock cells have higher power usage but also larger areas to dissipate the heat caused by the higher power usage. Thus, in many cases a size of the types of clock cells and the estimated power usage of those cells are both considered in determining power-usage density and thus sizes of keep-out regions.

By way of one example, assume a current power-usage density for clock cells of a particular type is estimated and represented as $PD_{current}$. Assume also that the size of the particular clock cell (as shown in FIG. 1), is a width of a and a height of b. Then, the width spacing is represented as x, and the height spacing is represented as y. This, along with an estimated target power density at which negative thermal effects are reduced or eliminated, is represented as $PD_{target}$. By so doing, the target power-usage density at which to avoid negative thermal effects can be achieved through a keep-out region having height and width spacings of x and y. This is represented mathematically as:

$$(a*b)*PD_{current}=(a+2x)*(b+2y)*PD_{target}$$

At 404, keep-out regions for each of multiple types of clock cells are determined based on the power-usage density of those types of clock cells. Continuing the example of FIG. 5, the placement manager 508 determines, for sixteen types of clock cells having progressively higher power-usage density, spacing (in both width and height dimensions) of each clock-cell type's respective keep-out region. The resulting keep-out regions are stored in media 506, at keep-out regions 510. While not shown, each of these width and height spacings from clock cell borders is from about 0.9 to about 3.35 microns, which corresponds to power-usage density for the 16 types of clock cells.

In addition to the power-usage density estimated for each type of clock cell, spacings for keep-out regions can be based on various factors. A spacing can be used that permits some small possibility of failure, for example, such that smaller spacing can be used, e.g., a failure rate of 0.1, 0.01, or 0.001 percent may be permitted. Also, a time of use for the clock cell can affect spacings associated with power-usage densities, which can be based on thermal characteristics of the IC, such as thermal conductivity and thermal mass. Thus, if a shorter time of use is expected, thermal affects, such as IR droop from a thermal runway, may need more time to become a problem, and thus smaller spacing for each type of clock cell can be permitted.

In this illustration, however, clock cell keep-out regions are based on maximum power-usage density over a steady state use (e.g., over an extended period of time). In this case, spacings are also equal for both width and height dimensions, though this is not required.

As noted above, the keep-out regions can be shaped as a rectangle, with or without identical spacings in all directions or even identical in both width or both height spacings. In addition to these rectangles, various other forms of keep-out regions are contemplated.

Figure 6:
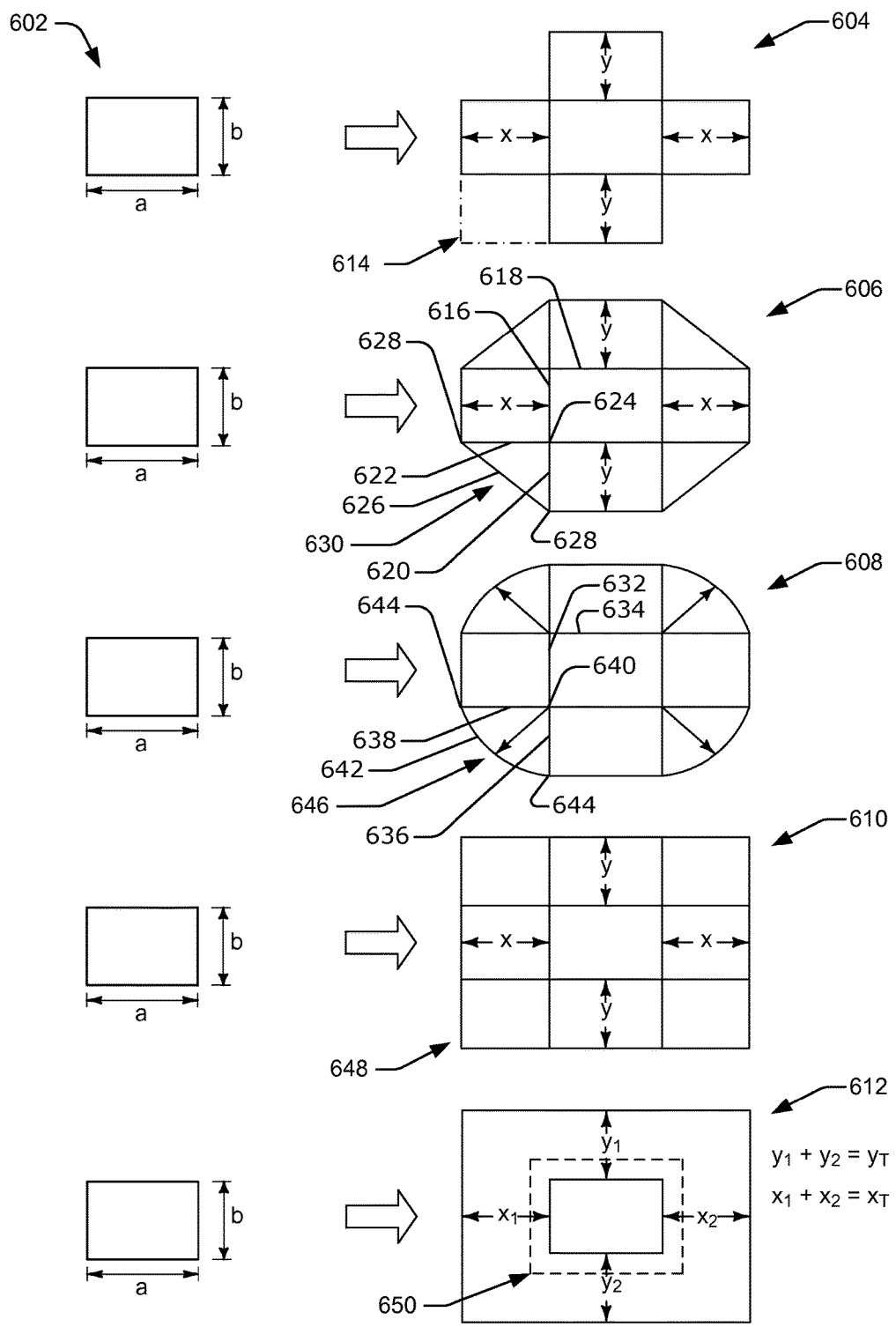
FIG. 6 illustrates an example clock cell and five different forms of keep-out regions.

Consider, for example, FIG. 6, which illustrates a clock cell 602, shown five times with five different forms of keep-out regions: free-corner keep-out region 604; half-corner keep-out region 606; curved-corner keep-out region 608; rectangular keep-out region 610; and flexible-spacing keep-out region 612.

The free-corner keep-out region 604 has width and height spacings from width and height borders of the clock cell 602 but does not have a spacing at corners of the clock cell 602, shown with free space 614.

The half-corner keep-out region 606 has width and height spacings (shown with y and x sizes) from width and height borders 616, 618 of the clock cell 602 bounded by edges of the width and height spacings 620, 622 nearest a corner 624 of the clock cell 602 and a line 626 from end points 628 of the edges of the width and height spacings 620, 622 to form half corner 630.

The curved-corner keep-out region 608 has width and height spacings (shown with y and x sizes) from width and height borders 632, 634 of the clock cell 602 bounded by edges of the width and height spacings 636, 638 nearest a corner 640 of the clock cell 602 and a curved, convex line 642 from end points 644 of the edges of the width and height spacings 636, 638 to form curved corner 646. The curved, convex line 642 can be an arc from the end points 644 of the edges of the width and height spacings 636, 638, shown with arrows marking movement of an arc to create the curved, convex line 642.

The curved corner 646 and a half corner 630 are examples of additional flexibility permitted by placing the clock cells 602, and approximate a region in which thermal runways, and thus IR droop, can exist. Such flexibility is not required, but can aid in additional placement flexibility and improved performance of the IC. The rectangular keep-out region 610, as shown in FIG. 6 and described above, benefit from a simple total height and width, enabling some greater simplicity in design and placement by the placement manager 508. The rectangular keep-out region 610 includes full corner 648.

Other forms of flexibility, other than corner size and shape, are also contemplated. Thus, consider the flexible-spacing keep-out region 612 determined by the placement manager 508. Here the clock cell 602 can be placed, within some area range 650 within the flexible-spacing keep-out region 612. Note that a total width or a total height of the first keep-out region is fixed for each of the multiple clocks cells of the first type but opposite width spacings or height spacings vary between the multiple clock cells of the first type one from another. Thus, a total width remains fixed for cells of the same type, as does the total height, but some allowance is permitted with area range 650.

Mathematically, this is represented as:

$$y_1+y_2=y_T$$

$$x_1+x_2=x_T$$

Thus, $y_T$ is the total height, $y_1$ is the height spacing on one side, and $y_2$ is the height spacing on an opposite side. Similarly, $x_T$ is the total height, $x_1$ is the height spacing on one side, and $x_2$ is the height spacing on an opposite side.

Figure 7:
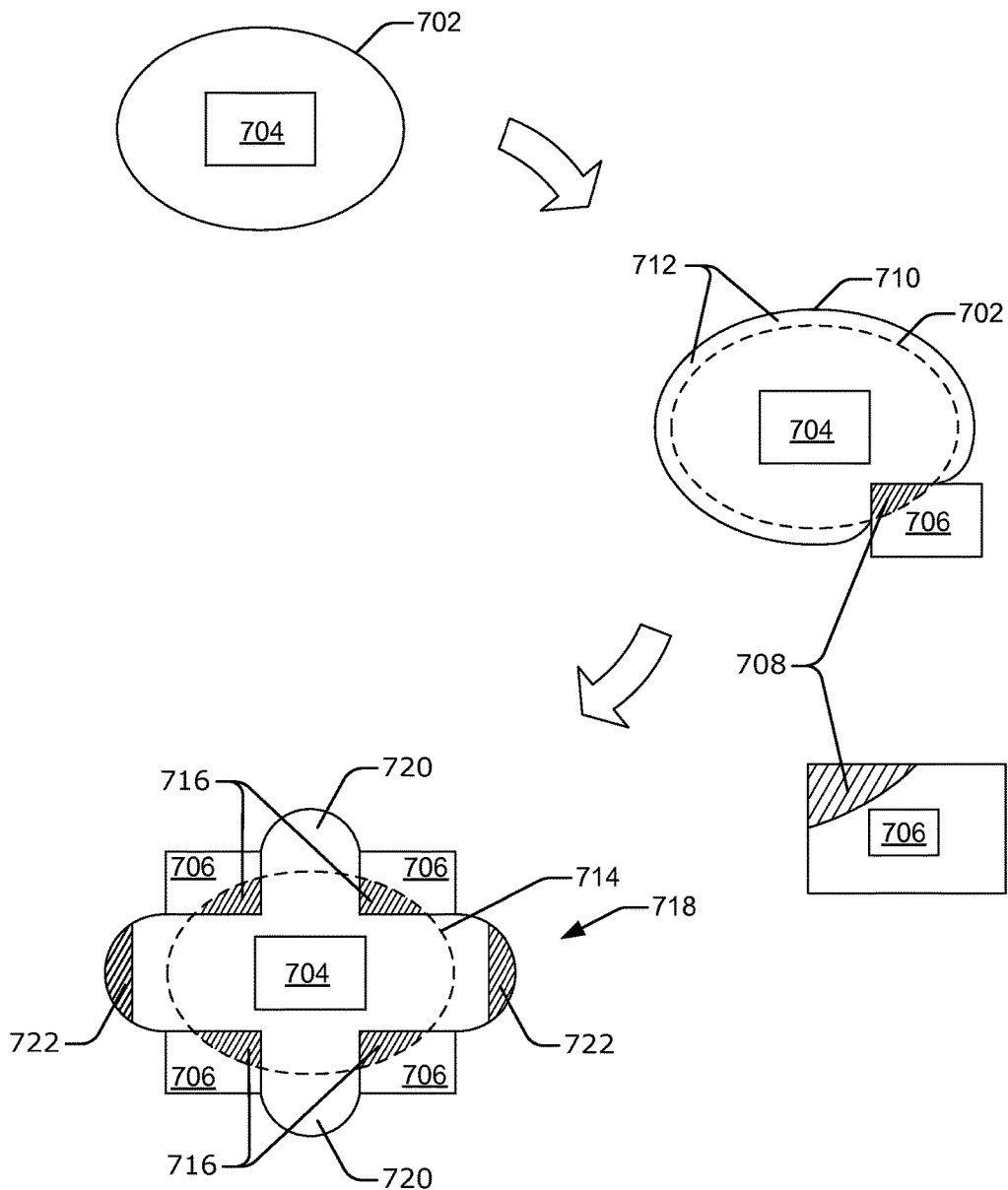
FIG. 7 illustrates an example balloon keep-out region, which is flexible in a width or height dimension but has a minimum area.

At 404, the placement manager 508 may determine yet another form of keep-out region, that of balloon keep-out region 702 as shown in FIG. 7. Balloon keep-out region 702 is flexible in the width or height dimension but is fixed in an area at least partially around each clock cell.

Here an initial keep-out region is an oval or ellipse. The initial keep-out region may be another shape in other examples, however. A clock cell 704 is within the balloon keep-out region 702, with another clock cell 706 having a small keep out region (shown in combination for visual brevity except for in enlarged form) placed within the balloon keep-out region 702. In so doing, an interference area 708 overlaps the balloon keep-out region 702 and the keep-out region of the clock cell 706. The amount of this interference area 708 (shown enlarged for clarity) is used, or some multiple of it is used (e.g., 1.2, 1.5, 2.0), to expand, or in case of no multiple, change a shape of, an area of the balloon keep-out region 702. This is shown at expanded balloon 710 with the area of expansion as expansion region 712 between the original balloon keep-out region and the expanded balloon 710.

For further explanation, consider four clock cells 706 (also with small keep-out regions) shown overlapping an original balloon keep-out region 714 at interference areas 716. The resulting expanded balloon 718 has four expansion regions, two permitted expansion regions 720 and two non-permitted expansion regions 722. The placement manager 508 may determine that some interference is permitted, while too much may reduce the effectiveness of the keep-out region, and thus introduce potential thermal runway. While an expansion area can be a multiple of the interference area to compensate for the location (e.g., the nearness of the clock cell 706 to the clock cell 704), this multiple has limits. Here placement manager 508 determines that non-permitted expansion regions 722 are too far from clock cell 704 to reduce heat buildup (the shaded region indicated as having too little benefit to heat dissipation of the clock cell 704). Thus, the placement of at least two of the four clocks cells 706 is not permitted.

Consider again region overlap 312 shown in FIG. 3. Here, as noted above, this region overlap 312 can be permitted or not permitted. For keep-out regions 604, 606, 608, 612, and 702, the region overlap 312 would likely be permitted. For rectangular keep-out region 610, the placement manager 508 would not permit the region overlap 312, and thus the placement of at least one of the two clock cells causing the region overlap 312.

At 406, keep-out regions are received for each of the types of clock cells. Note that in some cases keep-out regions are previously determined, or determined by another entity, and thus are received instead of determined. Thus, method 400 may begin at operation 406 or proceed from operation 402 or 404 to 408, skipping over operation 406. This is shown with dashed-line arrows in FIG. 4.

At 408, clock cells are placed without overlap of their respective keep-out regions, such as a keep-out region for one type of clock cell being placed within a keep-out region of another type of clock cell. These clock cells are placed in a layout for a portion of an integrated circuit, such as is the layout 302 of the portion of the integrated circuit (IC) shown in FIG. 3.

The method 400 can be repeated effective to build the IC having clock cells separated by spacings that vary for the type of clock cell and its power-usage density. By so doing, a layout for clock cells can better address both sufficient space to reduce heat and IR droop while concurrently permitting excellent timing closure and performance.

Example Electronic Device

With example keep-out regions and a layout described above, the discussion turns to an example electronic device in which an IC having power-density-based clock cell spacing can be implemented.

Figure 8:
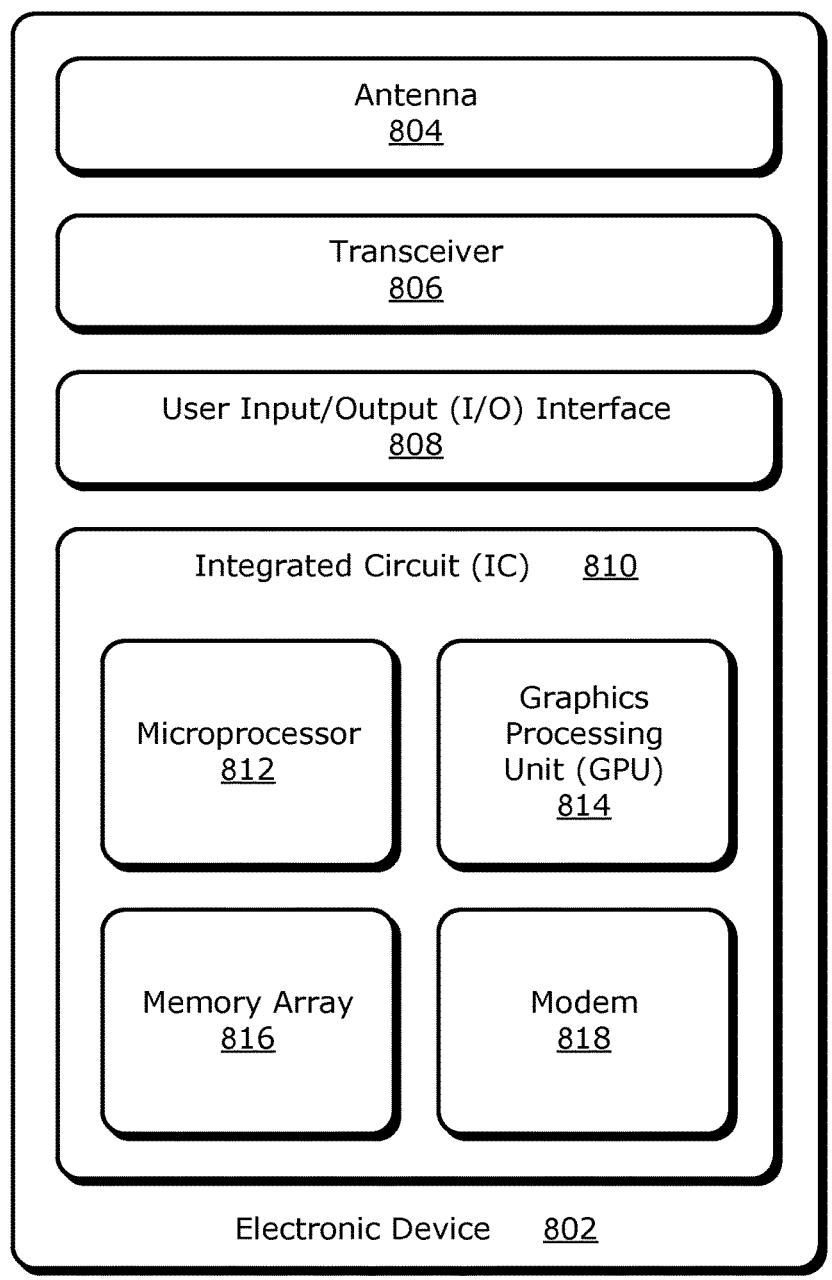
FIG. 8 illustrates an example electronic device in which a clock-cell layout may be used.

FIG. 8 illustrates an example electronic device 802. The electronic device 802 may be a mobile or battery-powered device or a fixed device that is designed to be powered by an electrical grid during operation. Examples of an electronic device 802 include a server computer, a network switch or router, a blade of a data center, a personal computer, a desktop computer, a notebook computer, a tablet computer, a smart phone, an entertainment appliance, or a wearable computing device such as a smartwatch, intelligent glasses, or an article of clothing. An electronic device 802 may also be a device, or a portion thereof, having embedded electronics. Examples of an electronic device 802 with embedded electronics include a passenger vehicle, industrial equipment, a refrigerator or other home appliance, a drone or other unmanned aerial vehicle (UAV), or a power tool.

For wireless capability, the electronic device 802 may include an antenna 804 coupled to a transceiver 806 to enable reception or transmission of wireless signals. For interacting with a user, the electronic device 802 can include a user input/output (I/O) interface 808, such as a keyboard, a mouse, a microphone, a touch-sensitive screen, a camera, an accelerometer, a haptic mechanism, a speaker, a display screen, or a projector, to name a few. The electronic device 802 includes an integrated circuit (IC) 810, which is coupled to the transceiver 806 to enable the IC 810 to have access to received wireless signals or to provide wireless signals for transmission via the antenna 804.

The IC 810 may comprise a microprocessor 812, a Graphical Processing Unit (GPU) 814, a memory array 816, and a modem 818, each of which may include a layout having clock cells with keep-out regions as noted above. The microprocessor 812 may function as a central processing unit (CPU) or another general-purpose processor. The GPU 814 may be especially adapted to process visual-related data to be displayed for the user. The memory array 816 stores data for the microprocessor 812, the GPU 814, or user files. Example types of memory for the memory array 816 include random access memory (RAM), such as dynamic RAM (DRAM) or static RAM (SRAM), flash memory, and so forth.

The modem 818 modulates a signal to encode information into the signal or demodulates a signal to extract encoded information. The IC 810 may include additional or alternative parts than those that are shown, such as an I/O interface, a transceiver or another part of a receiver chain, a customized or hard-coded processor such as an application-specific integrated circuit (ASIC), a sensor such as an accelerometer, and so forth.

The IC 810 may also comprise a system on a chip (SOC). An SOC may integrate a sufficient number or type of components to enable the SOC to provide computational functionality as a notebook, a mobile phone, or another electronic apparatus using exclusively or primarily one chip. Components of an SOC, or an IC 810 generally, may be termed blocks or cores. Examples of cores or circuitry blocks include a voltage regulator, a memory array, a memory controller, a general-purpose processor, a cryptographic processor, a modem, a vector processor, an I/O interface or communication controller, a wireless controller, and a GPU. Any of these cores or circuitry blocks, such as a processor or GPU core, may further include multiple internal cores. Each of these cores may include clock cells spaced through keep-out regions based on power-usage density, as noted above.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:

1. An integrated circuit comprising:
   multiple clock cells of a first type having a first keep-out region, the first type having a first power-usage density;
   multiple clock cells of a second type having a second keep-out region, the second type having a second power-usage density, the first and the second power-usage densities being different, a higher of the first and second power-usage densities having a larger keep-out region than a lower of the first and second power-usage densities; and
   a layout of the multiple clock cells of the first type and the second type on the integrated circuit, the layout separating the multiple clock cells of the first type and second type such that the respective keep-out regions of the respective clock cells do not overlap.

2. The integrated circuit of claim 1, wherein the first and second keep-out regions have sizes proportional to the first and second power-usage densities, respectively.

3. The integrated circuit of claim 1, wherein the clock cells of the first type are rectangular and the first keep-out region is a rectangle surrounding each of the clock cells of the first type.

4. The integrated circuit of claim 1, wherein the first keep-out region has same width spacings and height spacings, the width spacings having a distance from each of two width borders of the clock cells of the first type and the height spacings having a distance from each of two height borders of the clock cells of the first type.

5. The integrated circuit of claim 1, wherein the first keep-out region is formed as a free-corner keep-out region, the free-corner keep-out region having width and height spacings from width and height borders of the clock cells of the first type.

6. The integrated circuit of claim 1, wherein the first keep-out region is formed as a half-corner keep-out region, the half-corner keep-out region having width and height spacings from width and height borders of the clock cells of the first type and a half-corner spacing bounded by edges of the width and height spacings nearest a corner of the clock cells of the first type and a line from end points of the edges of the width and height spacings.

7. The integrated circuit of claim 1, wherein the first keep-out region is formed as a curved-corner keep-out region, the curved-corner keep-out region having width and height spacings from width and height borders of the clock cells of the first type and a curved-corner spacing bounded by edges of the width and height spacings nearest a corner of the clock cells of the first type and a curved, convex line from end points of the edges of the width and height spacings.

8. The integrated circuit of claim 7, wherein the curved, convex line is an arc from the end points of the edges of the width and height spacings.

9. The integrated circuit of claim 1, wherein the first keep-out region has a power-usage density less than the first power-usage density and the second keep-out region has a power-usage density less than the second power-usage density.

10. The integrated circuit of claim 1, wherein sizes of the first keep-out region and the second keep-out region are selected based on target power-usage densities which avoid negative thermal effects caused by the first and second power-usage densities.

11. A placement system comprising:
    one or more computer processors;
    one or more computer-readable media having instructions that, responsive to execution by the one or more computer processors, implements a placement manager, the placement manager configured to:
       receive, for a first type of clock cell, a first keep-out region;
       receive, for a second type of clock cell, a second keep-out region having a different size than the first keep-out region; and
       place in an integrated circuit the first type of clock cell and the second type of clock cell without overlap of the first keep-out region and the second keep-out region.

12. The placement system of claim 11, wherein the placement manager is further configured to determine, based on a power-usage density of the first type of clock cell and a power-usage density of the second type of clock cell, the first keep-out region and the second keep-out region, respectively.

13. The placement system of claim 12, wherein the placement manager is further configured to determine, prior to determination of the first and second keep-out regions, the power-usage densities of the first and second types of clock cells.

14. The placement system of claim 11, wherein the placement manager is further configured to place a data cell within the first keep-out region or the second keep-out region.

15. The placement system of claim 14, wherein the first keep-out region has a first width spacing and a first height spacing and the second keep-out region has a second width spacing and second height spacing, and wherein placement by the placement manager places the first type of clock cell and the second type clock cell at least a sum of the first width spacing and the second width spacing or the first height spacing and the second height spacing.

16. The placement system of claim 11, wherein the first keep-out region or the second keep-out region is a free-corner keep-out region, a half-corner keep-out region, a curved-corner keep-out region, a rectangular keep-out region, a flexible-spacing keep-out region, or a balloon keep-out region.

17. An integrated circuit comprising:
a clock-cell layout, the clock-cell layout based on respective power-usage densities of multiple clock cell types in the integrated circuit, the clock-cell layout having:
a first keep-out region associated with clock cells of a first type, the first type having a first power-usage density;
a second keep-out region associated with clock cells of a second type, the second type having a second power-usage density; and
a third keep-out region associated with clocks cells of a third type, the third type having a third power-usage density, the first power-usage density higher than the second power-usage density, the second power-usage density higher than the third power-usage density,
the first keep-out region representing an average of a total of multiple flexible keep-out regions around each of the clocks cells of the first type,
the second keep-out region representing an average of a total of multiple flexible keep-out regions around each of the clocks cells of the second type,
the third keep-out region representing an average of a total of multiple flexible keep-out regions around each of the clocks cells of the third type, and
the first keep-out region being larger than the second keep-out region and the second keep-out region being larger than the third keep-out region.

18. The integrated circuit of claim 17, wherein the first, second, and third keep-out regions surround each of the respective clock cells.

19. The integrated circuit of claim 17, wherein the first, second, and third keep-out regions vary in a width or height dimension but are of a fixed area.

20. The integrated circuit of claim 17, wherein the integrated circuit comprises a microprocessor, a graphical processing unit (GPU), a memory array, or a modem, and wherein the clock-cell layout is within a portion of the microprocessor, the GPU, the memory array, or the modem.

21. The integrated circuit of claim 17, wherein the first keep-out region being larger than the second keep-out region and the second keep-out region being larger than the third keep-out region is by having a larger width spacing, height spacing, or area.

22. A method for placing cells in an integrated circuit, executable by a placement system, the method comprising:
receiving or determining, for a first type of clock cell, a first keep-out region;
receiving or determining, for a second type of clock cell, a second keep-out region having a different size than the first keep-out region; and
placing the first type of clock cell and the second type of clock cell without overlap of the first keep-out region and the second keep-out region.

23. The method of claim 22, wherein the receiving or determining the first keep-out region and the second keep-out region determines the first and second keep-out regions, the first keep-out region determined based on a power-usage density of the first type of clock cell and the second keep-out region determined based on a power-usage density of the second type of clock cell.

24. The method of claim 23, wherein the power-usage density approximates potential thermal output.

25. The method of claim 23, wherein the power-usage density approximates potential IR droop.

26. The method of claim 23, further comprising determining, prior to determining the first and second keep-out regions, the power-usage density of the first type and second type of clock cells.

27. The method of claim 22, wherein the first keep-out region and the second keep-out region are spacings in a plane surrounding the first type and second type of clock cells, respectively, and have a width and a height spacing from borders of the first type and second type of clock cells, respectively.

28. The method of claim 27, wherein the first keep-out region has a first width spacing and a first height spacing and the second keep-out region has a second width spacing and second height spacing, and wherein placing the first type of clock cell and the second type clock cell spaces the first type of clock cell at least a sum of the first width spacing and the second width spacing or the first height spacing and the second height spacing from the second clock cell.

29. The method of claim 22, wherein the first keep-out region has a power-usage density less than the a power-usage density of the first type of clock cell, and the second keep-out region has a power-usage density less than a power-usage density of the second type of clock cell.

30. The method of claim 22, wherein sizes of the first keep-out region and the second keep-out region are selected based on target power-usage densities which avoid negative thermal effects caused by power-usage densities of the first type and second type of clock cells.

* * * * *